(12) United States Patent
Mikasa

(10) Patent No.: US 8,633,531 B2
(45) Date of Patent: Jan. 21, 2014

(54) SEMICONDUCTOR DEVICE

(76) Inventor: Noriaki Mikasa, Tokyo (JP)

( * ) Notice: Subject to any disclaimer, the term of this patent is extended or adjusted under 35 U.S.C. 154(b) by 468 days.

(21) Appl. No.: 12/889,437

(22) Filed: Sep. 24, 2010

(65) Prior Publication Data

US 2011/0073939 A1    Mar. 31, 2011

(30) Foreign Application Priority Data

Sep. 29, 2009 (JP) ................................. 2009-225298

(51) Int. Cl.
*H01L 21/00* (2006.01)

(52) U.S. Cl.
USPC .......................... 257/300; 257/330; 257/306

(58) Field of Classification Search
USPC ........................................ 257/300, 330, 306
See application file for complete search history.

(56) References Cited

U.S. PATENT DOCUMENTS

| | | | | |
|---|---|---|---|---|
| 7,683,437 B2 * | 3/2010 | Mikasa | ......................... | 257/401 |
| 7,696,576 B2 * | 4/2010 | Mikasa | ......................... | 257/365 |
| 7,700,456 B2 * | 4/2010 | Mikasa | ......................... | 438/424 |
| 7,705,401 B2 * | 4/2010 | Mikasa | ......................... | 257/347 |
| 7,851,303 B2 * | 12/2010 | Mikasa | ......................... | 438/253 |
| 7,902,592 B2 * | 3/2011 | Mikasa et al. | ................. | 257/324 |
| 2007/0228478 A1 * | 10/2007 | Mikasa | ......................... | 257/368 |
| 2008/0054374 A1 * | 3/2008 | Mikasa | ......................... | 257/401 |
| 2008/0061340 A1 * | 3/2008 | Heineck et al. | ............... | 257/301 |
| 2008/0064165 A1 * | 3/2008 | Kim et al. | ..................... | 438/264 |
| 2008/0073687 A1 * | 3/2008 | Wells | ............................ | 257/302 |
| 2008/0111197 A1 * | 5/2008 | Mikasa | ......................... | 257/386 |
| 2008/0128774 A1 * | 6/2008 | Irani et al. | ...................... | 257/314 |
| 2008/0142881 A1 * | 6/2008 | Mikasa | ......................... | 257/330 |
| 2008/0157206 A1 * | 7/2008 | Mikasa | ......................... | 257/365 |
| 2008/0164522 A1 * | 7/2008 | Mikasa | ......................... | 257/345 |
| 2008/0237698 A1 * | 10/2008 | Mokhlesi et al. | ............. | 257/326 |
| 2008/0296667 A1 * | 12/2008 | Mikasa | ......................... | 257/327 |
| 2009/0065860 A1 * | 3/2009 | Mikasa | ......................... | 257/330 |
| 2009/0090949 A1 * | 4/2009 | Mikasa | ......................... | 257/296 |
| 2009/0176368 A1 * | 7/2009 | Wu et al. | ....................... | 438/685 |
| 2009/0244954 A1 * | 10/2009 | Cannon et al. | ................ | 365/149 |
| 2009/0267125 A1 * | 10/2009 | Mikasa et al. | ................ | 257/300 |
| 2009/0315092 A1 * | 12/2009 | Mikasa | ......................... | 257/303 |
| 2009/0315097 A1 * | 12/2009 | Mikasa et al. | ................ | 257/324 |
| 2010/0001331 A1 * | 1/2010 | Mikasa | ......................... | 257/306 |
| 2010/0006930 A1 * | 1/2010 | Mikasa | ......................... | 257/332 |
| 2010/0032743 A1 * | 2/2010 | Huang et al. | ................. | 257/306 |
| 2010/0097854 A1 * | 4/2010 | Huang et al. | ............. | 365/185.01 |

(Continued)

FOREIGN PATENT DOCUMENTS

| | | |
|---|---|---|
| JP | 2004-303966 | 10/2004 |
| JP | 2007-005699 | 1/2007 |

(Continued)

*Primary Examiner* — Laura Menz

(74) *Attorney, Agent, or Firm* — Young & Thompson

(57) ABSTRACT

A semiconductor device may include, but is not limited to: a semiconductor substrate; a first insulating film; a conductive film; and a semiconductor film. The semiconductor substrate has a first hole. The semiconductor substrate has a first region into which a first impurity is introduced. The first region is adjacent to a side surface of the first hole. The first insulating film covers at least the side surface and a bottom surface of the first hole. The first insulating film has a second hole adjacent to the side surface of the first hole. The conductive film fills a bottom portion of the first hole. The semiconductor film is positioned over the conductive film. The semiconductor film fills the second hole and is in contact with the first region.

8 Claims, 17 Drawing Sheets

(56) References Cited

U.S. PATENT DOCUMENTS

| | | | |
|---|---|---|---|
| 2010/0148248 A1* | 6/2010 | Mikasa | 257/334 |
| 2010/0203703 A1* | 8/2010 | Tilke et al. | 438/424 |
| 2010/0276741 A1* | 11/2010 | Wells | 257/302 |
| 2011/0001185 A1* | 1/2011 | Mikasa | 257/327 |
| 2011/0003447 A1* | 1/2011 | Kim et al. | 438/270 |
| 2011/0037111 A1* | 2/2011 | Kim et al. | 257/302 |
| 2011/0057241 A1* | 3/2011 | Irani et al. | 257/314 |
| 2011/0070716 A1* | 3/2011 | Kim | 438/386 |
| 2011/0073925 A1* | 3/2011 | Park et al. | 257/306 |
| 2011/0073939 A1* | 3/2011 | Mikasa | 257/330 |
| 2011/0130004 A1* | 6/2011 | Lee | 438/696 |
| 2011/0151666 A1* | 6/2011 | Ko | 438/664 |
| 2011/0188288 A1* | 8/2011 | Minami | 365/145 |
| 2011/0198698 A1* | 8/2011 | Lee et al. | 257/368 |
| 2011/0233662 A1* | 9/2011 | Mikasa | 257/330 |
| 2011/0269279 A1* | 11/2011 | Lee | 438/270 |
| 2011/0298046 A1* | 12/2011 | Hong | 257/331 |
| 2011/0304028 A1* | 12/2011 | Kim | 257/623 |
| 2012/0009748 A1* | 1/2012 | Ji | 438/270 |
| 2012/0009760 A1* | 1/2012 | Kim | 438/430 |
| 2012/0012912 A1* | 1/2012 | Kwon | 257/302 |
| 2012/0018801 A1* | 1/2012 | Kobayashi et al. | 257/334 |
| 2012/0052668 A1* | 3/2012 | Lin | 438/589 |
| 2012/0056256 A1* | 3/2012 | Mikasa | 257/296 |
| 2012/0074518 A1* | 3/2012 | Kim et al. | 257/506 |
| 2012/0086074 A1* | 4/2012 | Hwang et al. | 257/334 |
| 2012/0094454 A1* | 4/2012 | Cho et al. | 438/270 |
| 2012/0112270 A1* | 5/2012 | Park et al. | 257/330 |
| 2012/0119278 A1* | 5/2012 | Mikasa | 257/306 |
| 2012/0119290 A1* | 5/2012 | Kim et al. | 257/331 |
| 2012/0126301 A1* | 5/2012 | Kunkel et al. | 257/306 |
| 2012/0132971 A1* | 5/2012 | Mikasa | 257/296 |
| 2012/0135605 A1* | 5/2012 | Kim | 438/696 |
| 2012/0146221 A1* | 6/2012 | Shim | 257/741 |
| 2012/0153380 A1* | 6/2012 | Lee et al. | 257/330 |
| 2012/0171846 A1* | 7/2012 | Hwang | 438/478 |
| 2012/0211815 A1* | 8/2012 | Mikasa | 257/306 |
| 2012/0217570 A1* | 8/2012 | Kim | 257/324 |
| 2012/0217612 A1* | 8/2012 | Baars et al. | 257/508 |
| 2012/0228702 A1* | 9/2012 | Wu | 257/330 |
| 2012/0282770 A1* | 11/2012 | Ko | 438/664 |
| 2012/0286354 A1* | 11/2012 | Cho | 257/330 |
| 2012/0289046 A1* | 11/2012 | Ko | 438/675 |
| 2012/0299073 A1* | 11/2012 | Mikasa | 257/296 |
| 2012/0302047 A1* | 11/2012 | Lee et al. | 438/482 |
| 2012/0326214 A1* | 12/2012 | Cho | 257/288 |

FOREIGN PATENT DOCUMENTS

| | | | | |
|---|---|---|---|---|
| JP | 2008060219 A | * | 3/2008 | |
| JP | 2008098553 A | * | 4/2008 | |
| JP | 2008153530 A | * | 7/2008 | |
| JP | 2009-010366 | | 1/2009 | |
| JP | 2009070975 A | * | 4/2009 | |
| JP | 2009152413 A | * | 7/2009 | |
| JP | 2010021328 A | * | 1/2010 | |
| JP | 2010141107 A | * | 6/2010 | |
| JP | 2011014750 A | * | 1/2011 | |
| JP | 2011205030 A | * | 10/2011 | |
| JP | 2012004230 A | * | 1/2012 | |
| JP | 2012054454 A | * | 3/2012 | |

* cited by examiner

SEMICONDUCTOR DEVICE

BACKGROUND OF THE INVENTION

1. Field of the Invention

The present invention relates to a semiconductor device.

Priority is claimed on Japanese Patent Application No. 2009-225298, filed Sep. 29, 2009, the content of which is incorporated herein by reference.

2. Description of the Related Art

The high integration of recent semiconductor devices has been achieved by miniaturization of transistors. The miniaturization of transistors has been reaching its limit If the size of transistors is further reduced, the transistors might malfunction due to the short channel effect.

To solve the problem, there has been provided a method of forming three-dimensional transistors including a silicon pillar vertically extending from a main surface of a semiconductor board. Such a three-dimensional transistor has a smaller occupied area and a fully-depleted SOI structure, and thereby can achieve a larger drain current and $4F^2$ DRAM cells.

When a vertical transistor including a silicon pillar is used as a cell transistor of a semiconductor memory device, generally, one of impurity diffusion regions, which is a source or a drain, is connected to a bit line. The other impurity diffusion region is connected to a memory element (cell capacitor in the case of DRAM). Generally, a memory element, such as a cell capacitor, is positioned above a cell transistor. Therefore, the memory element is disposed above the silicon pillar, and the bit line is disposed below the silicon pillar.

However, the semiconductor board is disposed below the silicon pillar. For this reason, it is necessary to embed a bit line in the semiconductor board. Regarding structures of bit lines, Japanese Patent Laid-Open Publication No. 2004-303966 discloses a method of forming a silicide layer over a bit line contact, and forming a metal wiring contact and a metal wiring over the silicide layer. However, the semiconductor device disclosed in the above related art does not include a pillar-type transistor.

Japanese Patent Laid-Open Publication No. 2007-5699 discloses a semiconductor device in which a diffusion layer, which is a bit line, is formed in a semiconductor board. However, the diffusion layer has high specific electrical resistance, thereby decreasing the operating speed of the semiconductor device.

Japanese Patent Laid-Open Publication No. 2009-10366 discloses a semiconductor device in which an embedded bit line is formed below a pillar portion. The bit line has a low resistance region made of a metal and the like, and a silicon region made of a silicon material. However, when a metal is used as the embedded bit line, a silicide layer might be formed, in a following thermal treatment process, between the metal forming the bit line and the silicon forming the semiconductor board. It is difficult to control the growth of the silicide layer. For this reason, if a silicide layer is excessively grown, the transistor might malfunction.

SUMMARY

In one embodiment, a semiconductor device may include, but is not limited to: a semiconductor substrate; a first insulating film; a conductive film; and a semiconductor film. The semiconductor substrate has a first hole. The semiconductor substrate has a first region into which a first impurity is introduced. The first region is adjacent to a side surface of the first hole. The first insulating film covers at least the side surface and a bottom surface of the first hole. The first insulating film has a second hole adjacent to the side surface of the first hole. The conductive film fills a bottom portion of the first hole. The semiconductor film is positioned over the conductive film. The semiconductor film fills the second hole and is in contact with the first region.

In another embodiment, a semiconductor device may include, but is not limited to: a semiconductor substrate; a first insulating film; a first conductive film; and a semiconductor film. The semiconductor substrate has a first portion upwardly extending from a main surface of the semiconductor substrate. The first insulating film covers a side surface of the first portion and the main surface of the semiconductor substrate. The first insulating film has a hole adjacent to the side surface of the first portion. The first conductive film covers a second portion of the first insulating film. The second portion covers the main surface of the semiconductor substrate. The semiconductor film is disposed over the first conductive film. The semiconductor film fills the hole and is in contact with the first portion.

In still another embodiment, a semiconductor device may include, but is not limited to: a semiconductor substrate; first and second insulating films; first and second wiring structures; and first and second conductive films. The semiconductor substrate has a first portion upwardly extending from a main surface of the semiconductor substrate. The first portion has first to fourth side surfaces. The first side surface faces opposite to the third side surface. The second side surface faces opposite to the fourth side surface. The first and second insulating films cover the first and third side surfaces of the first portion, respectively. The first and second wiring structures upwardly extend from the main surface of the semiconductor substrate. The first and second wiring structures are adjacent to the second and fourth side surfaces of the first portion, respectively. The first and second conductive films extend along the first and third side surfaces of the first portion, respectively. The first and second conductive films partially cover the first and second insulating films, respectively. Each of the first and second conductive films connects the first and second wiring structures.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Figure 1:
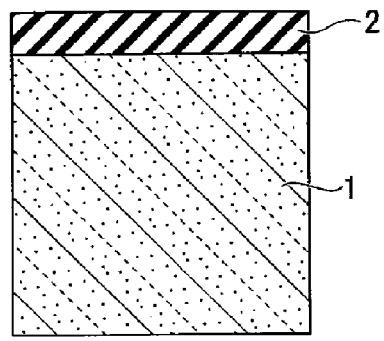
FIGS. 1 to 20 illustrate a process flow indicative of a method of manufacturing a semiconductor device according to a first embodiment of the present invention.

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

First Embodiment:

Hereinafter, a method of manufacturing a semiconductor device according to a first embodiment of the present invention is explained with reference to FIGS. 1 to 20.

The method of the first embodiment includes, but is not limited to: a first process of forming a first wiring in a first groove in a semiconductor board so that a semiconductor layer forming the first wiring is in contact with the semiconductor board; a second process of diffusing a dopant included in the semiconductor layer into the semiconductor board to form a first impurity diffusion layer; a third process of forming a second groove in the semiconductor board so as to form a pillar portion including the first impurity diffusion layer; a fourth process of forming a gate insulating film covering an inner surface of the second groove, and of forming a second wiring in the second groove; and a fifth process of forming a second impurity diffusion layer in an upper region of the pillar portion. Hereinafter, each of the processes is explained in detail.

In the first process, a first groove 4, which extends in a first direction, is formed in a semiconductor board 1. Then, a first wiring 11, which includes a conductive layer 6 and a semiconductor layer 10, is formed. The conductive layer 6 is made of a material that is non-silicidable. Then, the semiconductor layer 10 is made to be in contact with the semiconductor board 1.

FIGS. 1 to 12 are cross-sectional views illustrating the first process. FIGS. 2B and 8B are horizontal-sectional views illustrating the semiconductor board 1. FIGS. 2A and 8A are cross-sectional views taken along line X-X' shown in FIGS. 2B and 8B, and illustrate the semiconductor board 1 that is viewed in the first direction. The first and second directions are defined by arrows X and Y shown in FIGS. 2B and 8B, respectively. In the first embodiment, the first direction is perpendicular to the second direction.

Firstly, a first silicon nitride film 2 is formed over the semiconductor board 1, as shown in FIG. 1. The first silicon nitride film 2 has a thickness of, for example, 100 nm. The first silicon nitride film 2 serves as a mask for forming the first groove. Preferably, the semiconductor board 1 is made of a p-type silicon board. However, the semiconductor board 1 is not limited to the p-type silicon board. A germanium board, a silicon germanium board, and the like may be used instead.

Figure 2A:
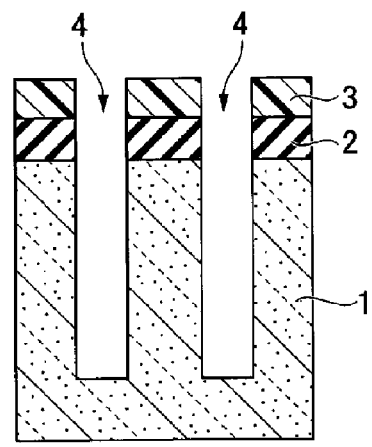
Figure 2B:
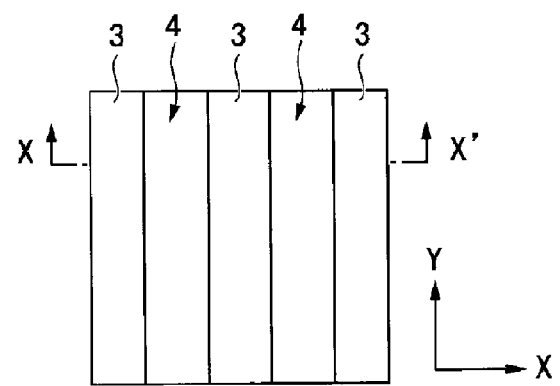

Then, a first photoresist mask 3 is formed over the first silicon nitride film 2. The first photoresist mask 3 serves as a mask for forming the first groove. The first photoresist mask 3 extends in the first direction (Y direction) and has a line-and-space structure as shown in FIG. 2B. The line portion has a width of, for example, 100 nm. Adjacent line portions are separated from each other by, for example, 100 nm.

Then, the first silicon nitride film 2 and the semiconductor board 1 are sequentially etched using the first photoresist mask 3 to form the first groove 4 in the semiconductor board 1. The first groove 4 extends in the first direction. Preferably, a depth of the first groove 4, which is measured from the level of an upper surface of the first groove 4, is approximately 300 nm. A horizontal width of the first groove is, for example, 100 nm. Thus, the first groove 4 extending in the first direction (Y direction) is formed.

Figure 3:
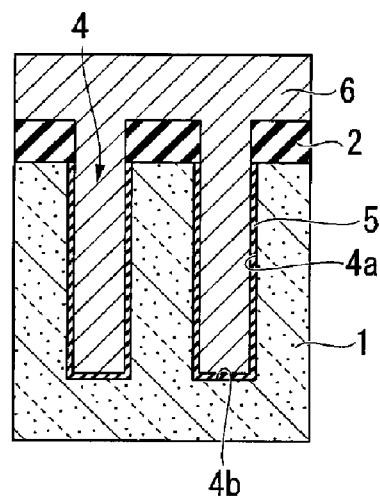

Then, the first photoresist mask 3 is removed. Then, an insulating film 5, which covers a side surface 4a and a bottom surface 4b of the first groove 4, is formed by thermal oxidization, as shown in FIG. 3. The insulating film 5 is made of a silicon oxide film and has a thickness of, for example, approximately 8 nm. The material forming the insulating film 5 is not limited thereto, and a high dielectric film may be used. Not only a thermal oxidization, but also CVD (Chemical Vapor Deposition) may be used for forming the insulating film 5.

Then, the conductive layer 6, which forms a bit line, is formed by CVD. Preferably, the conductive layer 6 is made of a material that is non-silicidable. In the first embodiment, a titanium nitride film is formed as the conductive layer 6. The conductive layer 6 has a thickness of, for example, 150 nm, so as to fully fill the first groove 4. Consequently, the conductive layer 6 fully fills the first groove 4 and covers the entire upper surface of the semiconductor board 1. Specific electrical resistance of the titanium nitride film is approximately 100 $\mu\Omega$·cm.

Figure 4:
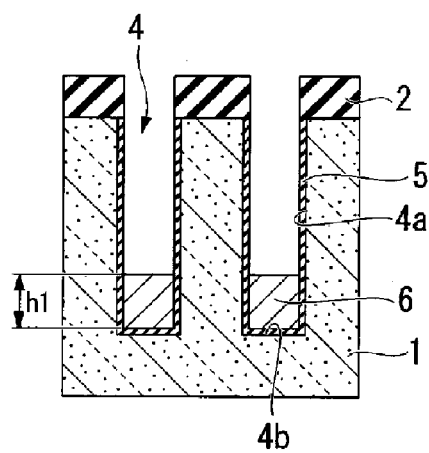

Then, the conductive layer 6 is etched so that only a bottom portion of the first groove 4 is filled with a remaining portion of the conductive layer 6, as shown in FIG. 4. In this case, preferably, the remaining portion of the conductive layer 6 has a vertical thickness h1 of approximately 150 nm, which is measured from a level of the bottom surface 4b of the first groove 4 to a level of the upper surface of the remaining portion of the conductive layer 6.

Figure 5:
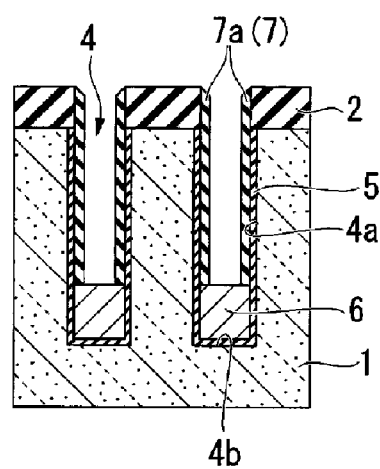

Then, a second silicon nitride film 7 is formed by CVD so as to cover the upper and side surfaces of the first silicon nitride film 2, a part of an upper surface of the conductive layer 6, and an exposed side surface of the insulating film 5. Preferably, the second silicon nitride film 7 has a horizontal thickness of 10 nm so as not to fully fill the first groove 4. Then, a portion of the second silicon nitride film 7, which covers the upper surface of the first silicon nitride film 2, is etched. Thus, the remaining portion of the second silicon nitride film 7 forms a sidewall film 7a. The upper surface of the conductive layer 6 is partially exposed by etching the second nitride film 7, as shown in FIG. 5. The material forming the sidewall film 7a is not limited to the silicon nitride film. Any material whose etching rate is different from that of the insulating film 5 may be used instead.

Figure 6:
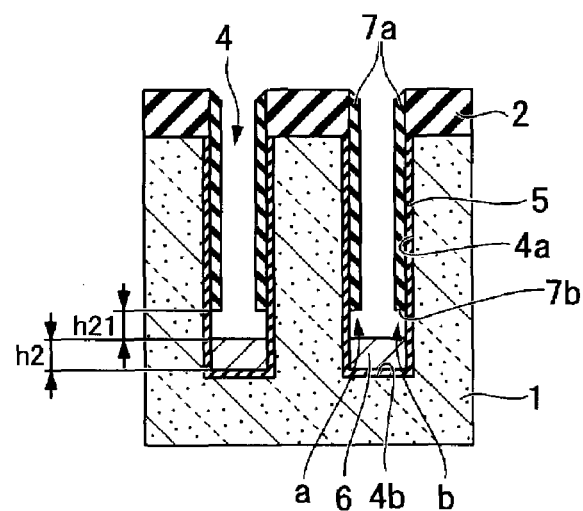
Figure 7:
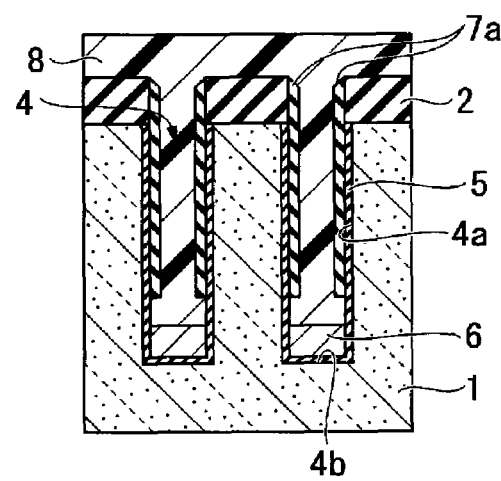
Figure 8A:
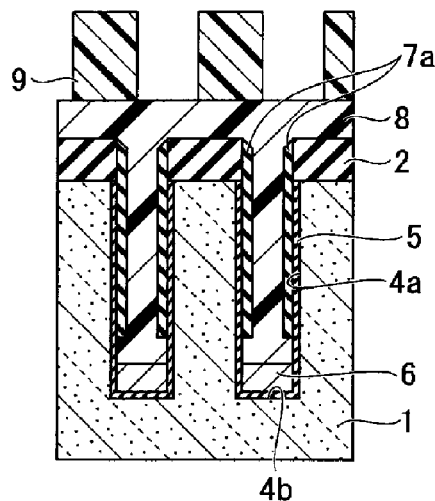
Figure 8B:
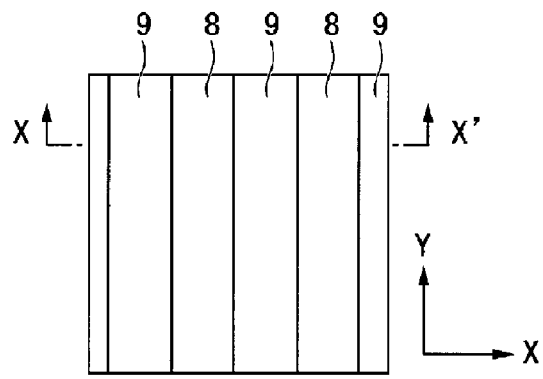
Figure 9:
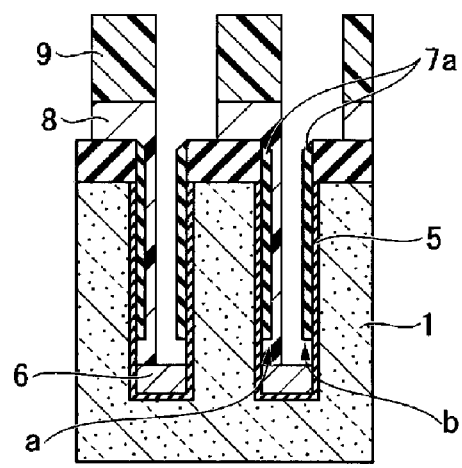

Then, the top portion of the conductive layer 6 is etched to reduce the vertical thickness thereof from the value h1 to a value h2 of approximately 50 nm, which is measured from the level of the bottom surface 4b of the first groove 4 to the etched upper surface of the conductive layer 6, as shown in FIG. 6. In this case, an isotropic etching is carried out so that a portion of the insulating film 5, which is lower in level than a bottom surface 7b of the sidewall film 7a, is exposed. Preferably, the isotropic etching is wet etching with an ammonia peroxide mixture, a sulfate peroxide mixture, and the like. Alternatively, isotropic dry etching may be used instead of the isotropic etching. Thus, space portions "a" and "b" are formed between the bottom surface of the sidewall 7a and the upper surface of the conductive layer 6, adjacent to the side surfaces 4a of the first groove 4. The space portions "a" and "b" have a height h21 of approximately 50 nm, which is measured from the level of the upper surface of the conductive layer 6 to the level of the bottom surface of the sidewall 7a Then, a flattening film 8 is formed so as to fully fill the first groove 4 and the first silicon nitride film 2, as shown in FIG. 7. Preferably, the flattening film 8 is made of an organic film, such as an organic antireflective film. Preferably, the flattening film 8 has a thickness of approximately 80 nm.

Then, a second photoresist mask 9 is formed over the flattening film 8, as shown in FIG. 8. The second photoresist mask 9 extends in the first direction (Y direction). The second photoresist mask 9 has a line-and-space pattern. Each line portion of the photoresist mask 9 overlaps half of the first groove 4 and half of the first silicon nitride film 2 in plan view. Preferably, each line portion of the photoresist mask 9 has a horizontal width of approximately 100 nm. Preferably, adjacent line portions of the photoresist mask 9 are separated from each other by approximately 100 nm.

Then, the flattening film 8 is patterned by dry etching using the second photoresist mask 9. Then, the flattening film 8 is etched using the second photoresist mask 9. Thus, half of the upper surface of the conductive layer 6 is exposed. The dry etching is carried out under a condition such that the first nitride film 2 and the sidewall film 7a are not fully removed. At the same time, the portion of the insulating film 5, which is exposed to the space portion "b", is exposed by the dry etching. In this case, the space portion "a" is kept covered by the flattening film 8 and therefore is not exposed by the dry etching.

Alternatively, an intermediate film, such as an oxide film and a nitride film, may be formed between the second photoresist mask 9 and the flattening film 8. Then, the intermediate film may be etched using the second photoresist mask 9. Then, the flattening film 8 may be etched using the intermediate film as a mask.

It has been explained here that the mask pattern for exposing half of the upper surface of the conductive layer 6 is formed using the flattening film 8. However, if a photoresist pattern, which overlaps half of the first groove 4 in plan view, can be formed in the process of forming the second photoresist mask 9 shown in FIG. 8, the flattening film 8 may be formed. In this case, the etching process may be omitted, thereby enabling a reduction in costs.

Figure 10:
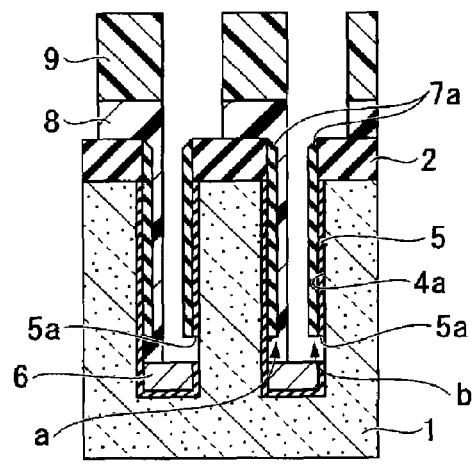

Then, the portion of the insulating film 5, which is exposed to the space portion "b", is removed by wet etching, as shown in FIG. 10. The wet etching is carried out using HF (hydrofluoric acid), at an etching rate of 30 nm per minute, for approximately one minute. The amount of the wet etching is such that a silicon oxide film is removed by approximately 30 nm in thickness. Thus, a contact hole 5a is formed so as to partially expose the side surface 4a of the first groove 4. The sidewall film 7a and the conductive layer 6 serve as masks for forming the contact hole 5a. Instead of the wet etching, isotropic dry etching using a gas containing HF and the like may be carried out. Thus, the contact hole 5a, which partially exposes the one side surface 4a of the first groove 4, is formed.

Figure 11:
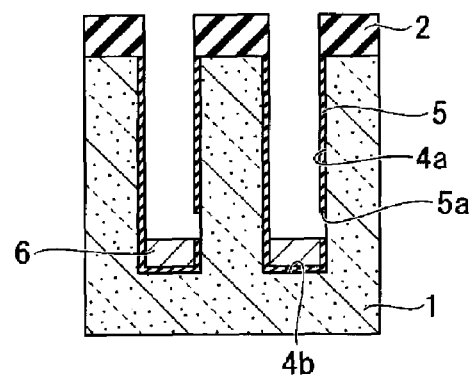

Then, the second photoresist mask 9 is removed using a resist removing solution. Then, the flattening film 8 is removed by ashing, as shown in FIG. 11. Then, the sidewall film 7a is removed by etching so as to expose the insulating film 5. The etching of the insulating film 5 is preferably wet etching using a heated phosphoric acid solution. When the sidewall film 7a is etched, an upper portion of the first silicon nitride film 2 is also etched.

Figure 12:
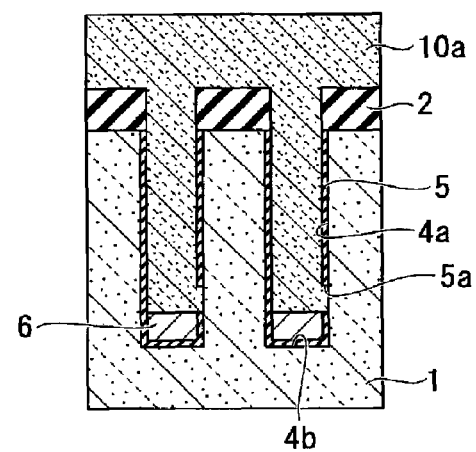

Then, a doped silicon film 10a, which will form a semiconductor layer, is formed by CVD so as to fully fill the first groove 4, as shown in FIG. 12. A film containing arsenic as an impurity, which has a thickness of, for example, 150 nm is used as the doped silicon film 10a. A film containing phosphorus as an impurity may be used as the doped silicon film 10a.

Figure 13:
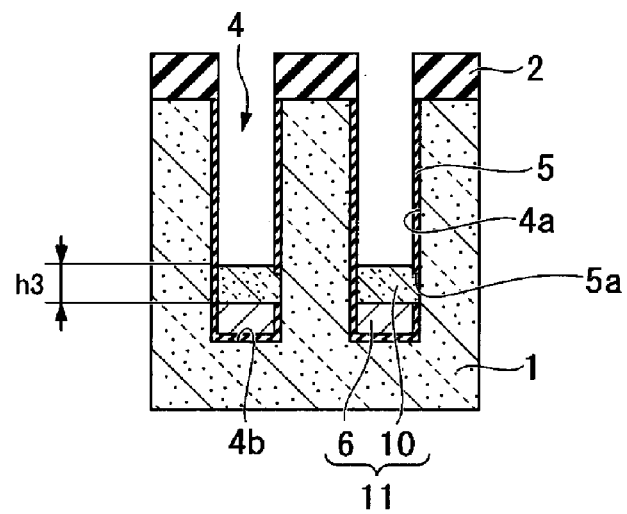

Then, the doped silicon film 10a is dry etched so that a remaining portion of the doped silicon film 10a has a thickness h3 of approximately 50 nm, which is measured from the level of the upper surface of the conductive layer 6 to the level of the upper surface of the remaining portion of the doped silicon film 10a, as shown in FIG. 13. The remaining portion of the doped silicon film 10a forms a semiconductor layer 10.

Thus, the conductive layer 6 and the semiconductor layer 10 form the first wiring (bit line) 11. Both the conductive layer 6 and the doped silicon film have a thickness of approximately 50 nm. The first wiring 11 includes a titanium nitride film forming the conductive layer 6 and a doped silicon film forming the semiconductor layer 10 over the conductive layer 6. The titanium film is made of a low resistance material. The semiconductor layer 10 is in contact with the semiconductor board 1 via the contact hole 5a. Specifically, the semiconductor layer 10 fills the contact hole 5a and is in contact with the semiconductor board 1. Thus, a contact between the first wiring 11 and the semiconductor board 1 is achieved between the semiconductor layer 10 and the semiconductor board 1. Thus, the contact is not achieved by a silicide layer between a metal film and a silicon film, thereby stabilizing the contact characteristics against the thermal treatment.

Figure 14:
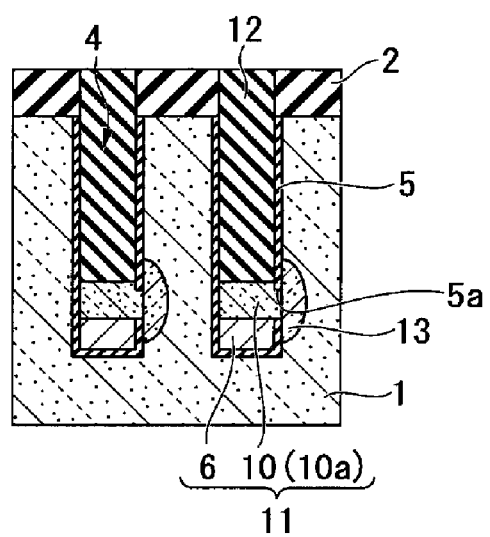

In the second process, a dopant included in the semiconductor layer 10 is diffused into the semiconductor board 1 to form a first impurity diffusion layer 13. FIG. 14 illustrates the second process. FIG. 14 is a cross-sectional view illustrating the semiconductor board 1 that is viewed in the second direction.

Firstly, an insulating film 12, which fills the first groove 4, is formed over the first wiring 11, as shown in FIG. 14. Preferably, an SOD film having a thickness of, for example, 200 nm, is used as the insulating film 12. Alternatively, a silicon oxide film, a BPSG film, and the like may be formed by CVD as the insulating film 12.

Then, a thermal treatment is carried out to subject the insulating film 12 to an annealing process and to diffuse a dopant included in the doped silicon film 10a into the semiconductor board 1. Thus, arsenic included in the doped silicon film 10a is diffused into the semiconductor board 1, and thereby the first impurity diffusion layer 13 is formed. The first impurity diffusion layer 13 extends in the range of approximately 50 nm in the upward, horizontal, and downward directions. Preferably, the thermal treatment is a rapid thermal treatment at a temperature of 1000° C., for approximately 10 seconds.

Figure 15A:
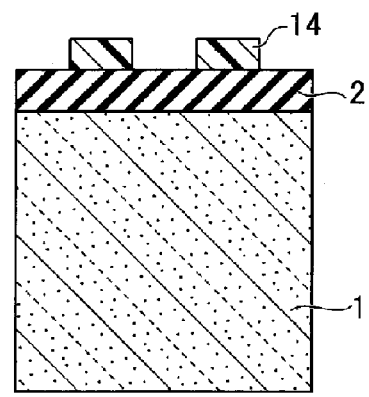
Figure 15B:
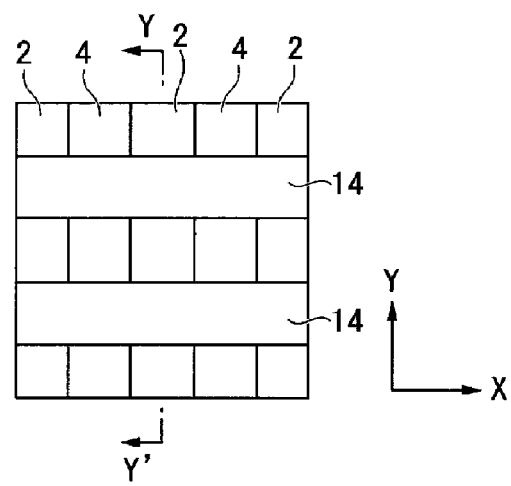
Figure 16A:
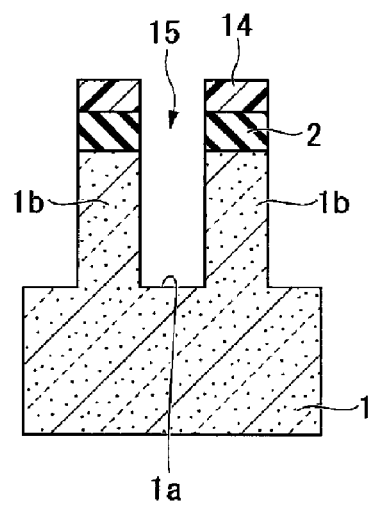
Figure 16B:
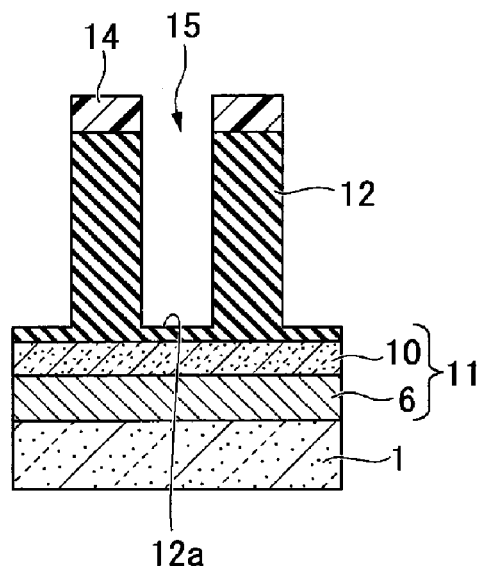
Figure 16C:
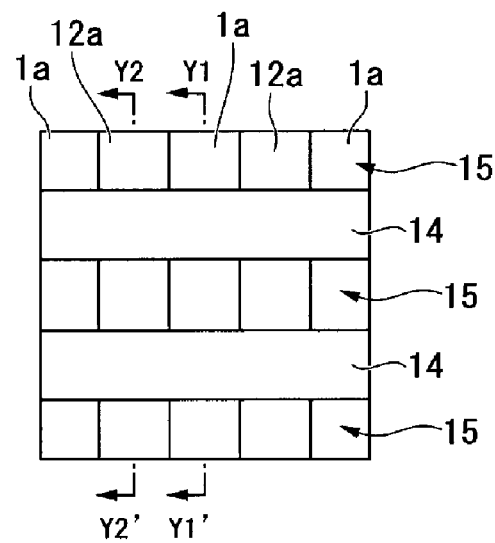

In the third process, a second groove extending in the second direction is formed to form a pillar portion including the first impurity diffusion layer 13. FIGS. 15 and 16 illustrate the third process. FIG. 15B is a plan view illustrating the semiconductor board 1. FIG. 15A is a cross-sectional view taken along line Y-Y' shown in FIG. 15B. FIG. 16C is a plan view illustrating the semiconductor board 1. FIGS. 16A and 16B are cross-sectional views taken along lines Y1-Y1' and Y2-Y2', respectively.

Firstly, a third photoresist mask 14 is formed over the insulating film 12 and the first nitride film 2, as shown in FIGS. 15A and 15B. The third photoresist mask 14 is used for forming the second groove 14. The third photoresist mask 14 has a line-and-space structure extending in the second direction (X direction). Each line portion has a width of approximately 100 nm. Adjacent line portions are separated from each other by approximately 100 nm.

Then, the insulating film 12 is etched by approximately 250 nm in thickness using the third photoresist mask 14, such that the first wiring (bit line) 11 is not exposed, as shown in FIG. 16B. A remaining lower portion of the insulating film 12 over the first wiring 11 has a thickness of approximately 50 nm. In this case, the first silicon nitride film 2 over the first semiconductor board 1 is removed by etching the insulating film 12 so as to expose the first semiconductor board 1. The etching of the insulating film 12 is, for example, dry etching with a gas containing carbon tetrafluoride ($CF_4$). Alternatively, the first silicon nitride film 2 may remain after the etching of the insulating film 12, and then the first silicon nitride film 2 may be removed by the dry etching.

Then, the semiconductor board 1 having been present under the first silicon nitride film 2 is etched by 150 nm in thickness, as shown in FIG. 16A. In this case, an etched bottom surface 1a of the semiconductor board 1 and an etched bottom surface 12a of the insulating film 12 preferably have the same level.

Thus, the insulating film 12 and the semiconductor board 1 are sequentially etched, and thereby the second groove 15 extending in the second direction (X direction) is formed. The second groove 15 is perpendicular to the first groove 4. The second groove 15 crosses the first groove 4. Thus, the pillar portion 1b is defined by the first and second grooves 4 and 15. Multiple pillar portions 1b are formed in a matrix along the first and second directions (Y and X directions).

Although, in the method of forming the second groove 15, the insulating film 12 is etched before the semiconductor board 1 is etched, the semiconductor board 1 may be etched before the insulating film 12 is etched. Alternatively, the semiconductor board 1 and the insulating film 12 may be simultaneously etched to form the second groove 15.

In the fourth process, a gate insulating film 16, which covers inner side surfaces of the second groove 15 (i.e., side surfaces of the pillar portion 1b), is formed. Then, a second wiring 17, which is adjacent to the pillar portion 1b via the gate insulating film 16, is formed in the second groove 15.

Figure 17A:
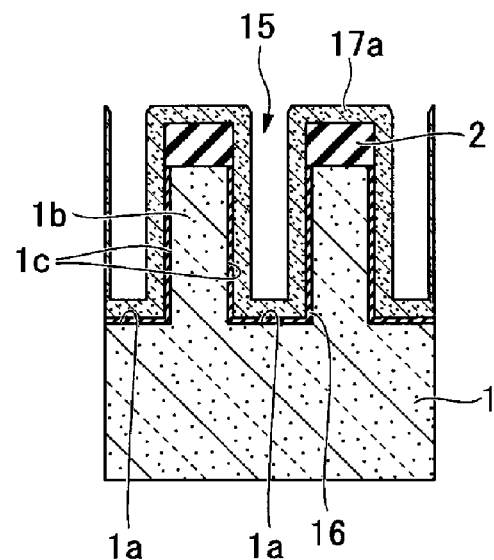
Figure 17B:
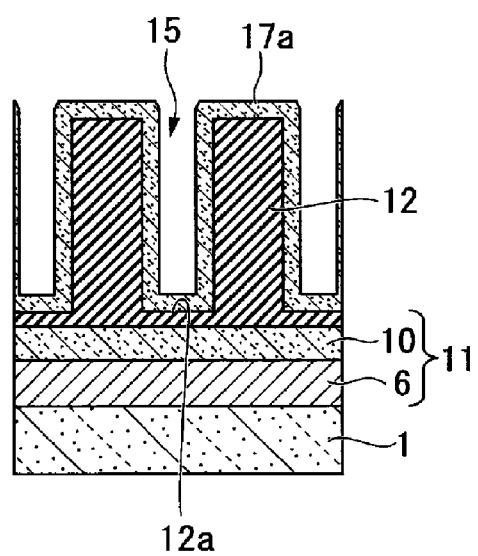
Figure 18A:
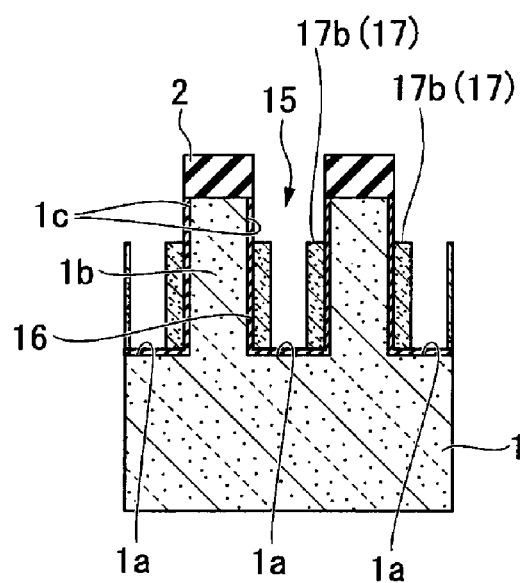
Figure 18B:
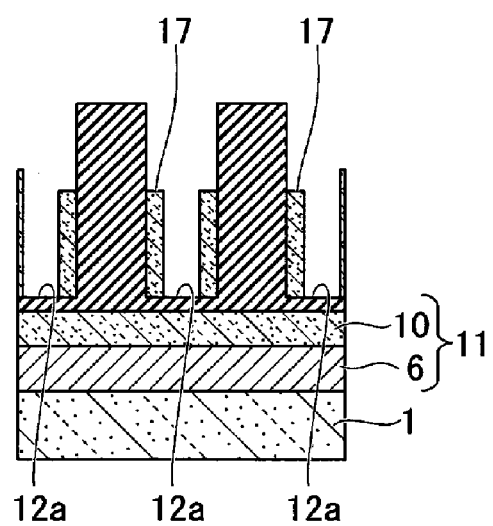
Figure 18C:
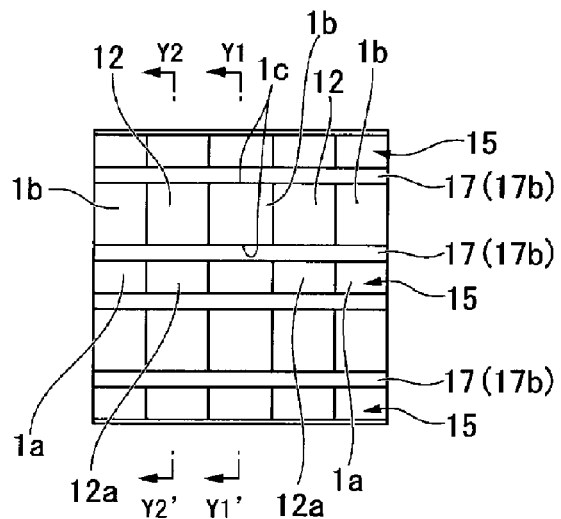

FIGS. 17 and 18 illustrate the fourth process. FIGS. 17A and 17B are cross-sectional views illustrating the semiconductor board 1 that is viewed in the second direction. FIG. 18C is a plan view illustrating the semiconductor board 1. FIGS. 18A and 18B are cross-sectional views taken along lines Y1-Y1' and Y2-Y2' shown in FIG. 18C, respectively.

Firstly, the third photoresist mask 14 is removed as shown in FIGS. 17A and 17B. Then, the gate insulating film 16 is formed by thermal oxidization so as to cover side surfaces 1c of the pillar portion 1b and the bottom surface 1a of the semiconductor board 1. The gate insulating film 16 is made of, for example, a silicon oxide film. However, the material forming the gate insulating film 16 is not limited to the silicon oxide film. Instead, a silicon nitride film, a high dielectric film formed by CVD, and the like may be used. Preferably, the gate insulating film has a thickness of approximately 6 nm.

Then, a conductive film 17a for forming the second wiring 17 is formed over the entire surface. Specifically, a phosphorus-doped silicon film, which has a thickness of 30 nm, is formed by CVD. Alternatively, a tungsten silicide film, a high melting point metal film, and the like may be used as the conductive film 17a.

Then, the conductive film 17a is dry etched to form a gate electrode 17b, as shown in FIGS. 18A and 18B. The gate electrode 17b upwardly extends from the bottom surface 12a of the insulating film 12. The gate electrode 17b covers lower side surfaces of the pillar portion 1b through the gate insulating film 16. The gate electrode 17b is adjacent to the side surface 1c of the pillar portion 1b via the gate insulating film 16. The gate electrode 17b has a height of approximately 100 nm, which is the gate length. The height of the gate electrode 17b is adjusted by controlling the etching amount. Upper side surfaces of the first pillar 1b, which has a vertical length of approximately 50 nm, are exposed.

The gate electrode 17b forms the second wiring 17 that extends in the second direction (X direction) in plan view so as to cover the side surfaces 1c of the pillar portion 1b and side surfaces of the insulating film 12. Portions of the second wiring 17, which covers the opposing side surfaces 1c of the pillar portion 1b through the gate insulating film 16, are the gate electrodes 17b. The same voltage can be applied to the gate electrodes 17b that cover the two opposing side surfaces 1c of the pillar portion 1b.

Figure 19A:
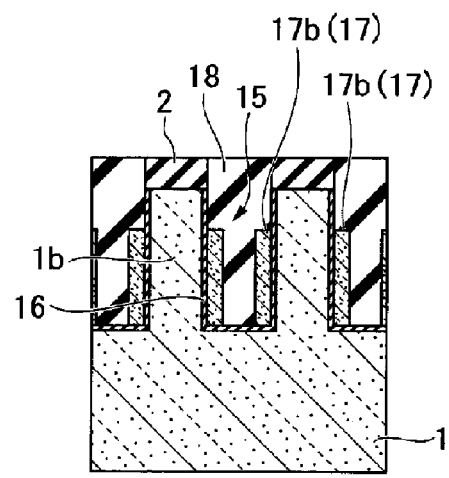
Figure 19B:
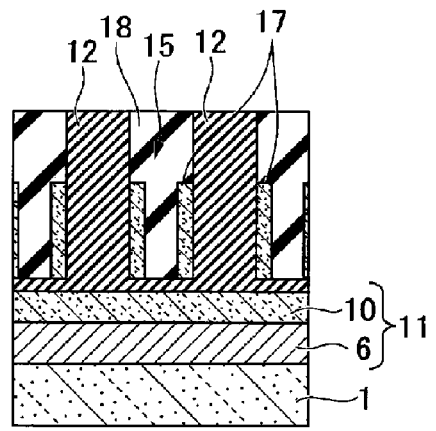
Figure 20A:
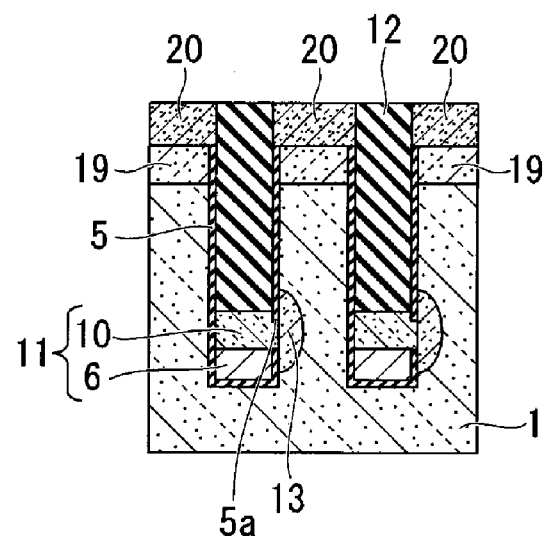
Figure 20B:
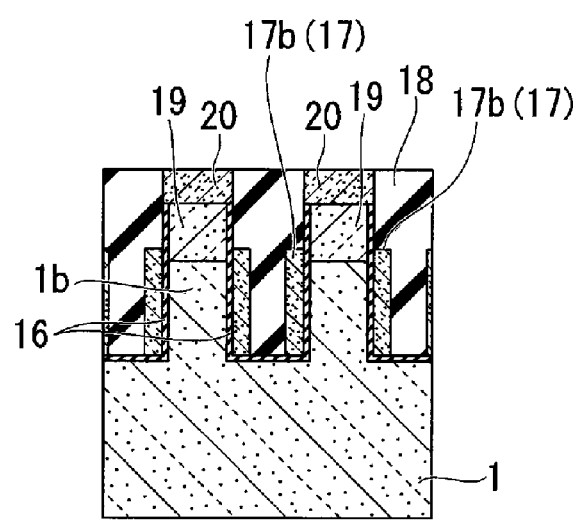
Figure 20C:
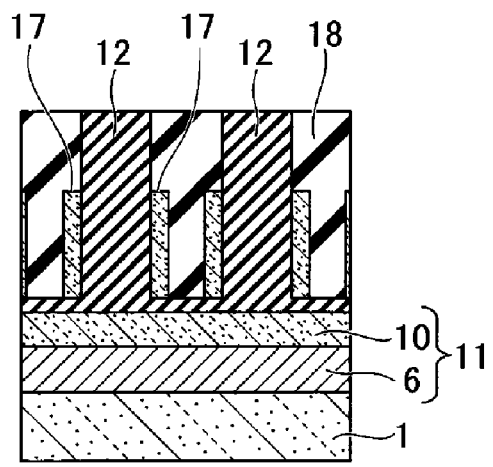
Figure 20D:
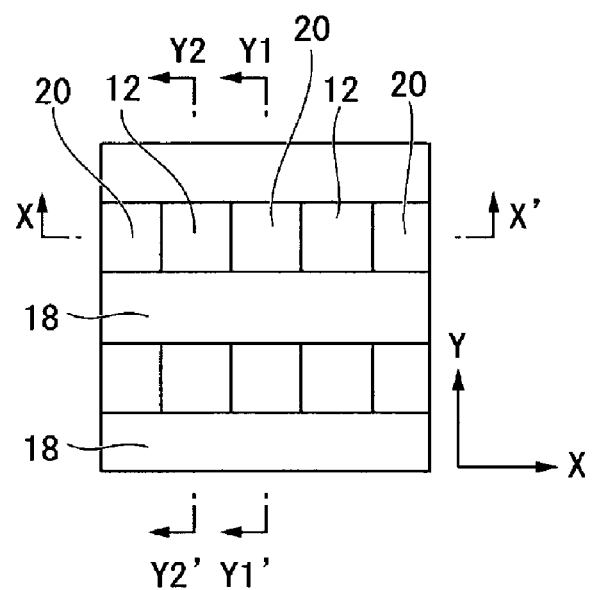

In the fifth process, a second impurity diffusion layer 19 is formed in a top region of the pillar portion 1b. FIGS. 19 and 20 illustrate the fifth process. FIGS. 19A and 19B are cross-sectional views illustrating the semiconductor board 1 that is viewed in the second direction. FIG. 20D is a plan view illustrating the semiconductor board 1. FIG. 20A is a cross-sectional view taken along line X-X' shown in FIG. 20D. FIGS. 19A and 20B are cross-sectional views taken along line Y1-Y1' shown in FIG. 20D. FIGS. 19B and 20C are cross-sectional views taken along line Y2-Y2' shown in FIG. 20D.

Firstly, a first inter-layer insulating film 18, which fills the second groove 15, is formed as shown in FIGS. 19A and 19B. For example, an SOD film, which has a thickness of approximately 200 nm, is formed as the first inter-layer insulating film 18. Alternatively, a silicon oxide film, a BPSG film, and the like may be formed by CVD as the first inter-layer insulating film 18.

Then, an upper surface of the first inter-layer insulating film 18 is polished by CMP so that the upper surface of the first silicon nitride film 2 is exposed. In this case, dry etching may be used instead of CMP. Thus, the upper surface of the first silicon nitride film 2 and the upper surface of the insulating film 12 have the same level.

Then, the first silicon nitride film 2 is removed by etching so as to expose an upper surface of the pillar portion 1b, as shown in FIG. 20B. Preferably, the etching of the first silicon nitride film 2 is wet etching using a heated phosphorus solution.

Then, an n-type impurity is introduced into a top region of the pillar portion 1b. For example, arsenic is ion implanted at an energy of 10 KeV, at a dose of $1 \times 10^{15}$ atoms/cm$^2$. Thus, the second impurity diffusion layer 19 is formed in the upper region of the pillar portion 1b. Phosphorus may be used as an impurity.

Then, a thermal treatment is carried out to activate the impurity introduced into the pillar portion 1b. Preferably, the thermal treatment is a heated thermal treatment at a temperature of 900° C., for 30 seconds. Accordingly, the first diffusion layer 13 and the second diffusion layer 19 are thermally diffused. The first impurity diffusion layer 13 extends in the semiconductor board 1 in the range of approximately 60 nm. Consequently, the first impurity diffusion layer 13 extends to a region of the semiconductor board 1, which is under the gate electrode 17b. In other words, the extended first impurity diffusion layer 13 partially overlaps the gate electrode 17b in plan view.

Then, a phosphorus-doped silicon film is formed over the first inter-layer insulating film 18 so as to fill a portion where the first silicon nitride film has been present. The doped silicon film has a thickness of, for example, 200 nm. Then, an upper surface of the doped silicon film is polished by CMP so that an upper surface of the first inter-layer insulating film 18 is exposed. Thus, a contact plug 20 is formed over the pillar portion 1b. Alternatively, the contact plug 20 may be formed by partially removing the doped silicon film using dry etching instead of CMP. Thus, a vertical transistor, which includes the pillar portion 1b, the gate electrode 17, the first and second impurity diffusion layers 13 and 19, is formed.

Figure 21A:
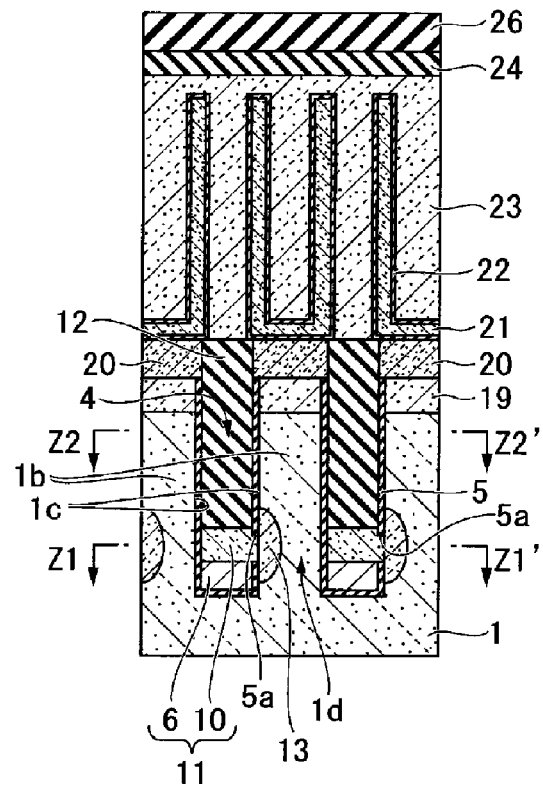
FIG. 21 is a cross-sectional view illustrating a semiconductor device according to the first embodiment.
Figure 21B:
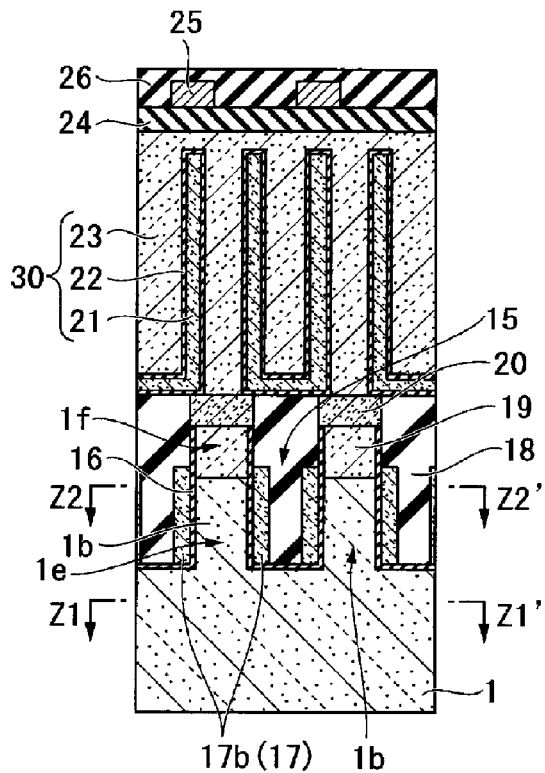

Then, a first capacitor electrode 21, which is connected to the contact plug 20, is formed as shown in FIGS. 21A and 21B. The first capacitor electrode 21 has a hollow circular cylindrical structure having bottom and side surfaces. Preferably, a phosphorus-doped silicon film is formed as the first capacitor electrode 21. Alternatively, a high melting point metal film, such as a titanium nitride film, may be formed.

Then, a capacitor insulating film 22 is formed by CVD so as to cover the entire surface of the first capacitor electrode 21. Preferably, the material forming the capacitor insulating film 22 is a tantalum pentoxide ($Ta_2O_5$) film. However, the material of the capacitor insulating film 22 is not limited thereto, and a high dielectric film, such as an aluminum oxide ($Al_2O_5$) film and a hafnium oxide ($HfO_2$) film, may be used.

Then, a second capacitor electrode 23, which covers the first capacitor electrode 21 and the capacitor insulating film 22, is formed. Preferably, the material forming the second capacitor electrode 23 is a phosphorus-doped silicon film. Alternatively, a high melting point metal film, such as a titanium nitride film, may be used.

Then, a second inter-layer insulating film 24 is formed over the second capacitor electrode 23. Preferably, the material forming the second inter-layer insulating film 24 is a silicon oxide film.

Then, a wiring layer 25 is formed over the second inter-layer insulating film 24. A multi-layered film including a titanium nitride film and an aluminum film may be formed as the wiring layer 25.

Then, a third-inter layer insulating film 26 is formed to cover the wiring layer 25 and the second inter-layer insulating film 24. A silicon oxide film may be formed as the third-inter layer insulating film 26. Thus, the semiconductor device of the first embodiment is completed.

According to the method of the first embodiment, a contact between the first wiring 11 (bit line) and the semiconductor board 1 is achieved by a contact between the doped silicon film (semiconductor layer 10) and the semiconductor board 1, not by a silicide layer between a metal film and a silicon film. For this reason, the contact characteristics can be stabilized against a thermal treatment.

Additionally, the conductive layer 6 and the semiconductor layer 10 forms the first wiring 11. The conductive layer 6 is made of a material that is non-silicidable. The first wiring 11 is formed by diffusing a dopant included in the semiconductor layer 10 into the semiconductor board 1. Accordingly, there is no possibility of a silicide layer being excessively formed from the conductive layer 6 when the first impurity diffusion layer 13 is formed.

Further, there is no possibility of a silicide layer being formed between the semiconductor layer 11 and the semiconductor board 1, thereby preventing an increase in contact resistance between the first wiring 11 and the first impurity diffusion layer 13.

Moreover, there is no possibility of a silicide layer being formed between the conductive layer 6 and the semiconductor layer 10, thereby preventing an increase in the specific electrical resistance of the first wiring 11. Accordingly, a semiconductor device with low power consumption, which includes the first wiring 11 having low specific electrical resistance and which can prevent excessive growth of a silicide layer, can be manufactured.

Additionally, only the semiconductor layer 10 included in the first wiring 11 is made to be in contact with the semiconductor board 1 via the contact hole 5a. Then, the first impurity diffusion layer 13 can be reliably formed by a thermal treatment.

Further, the conductive layer 6 and the sidewall film 7a can be used as masks for forming the contact hole 5a. For this reason, the position and size of the contact hole 5a can be controlled precisely, though the contact hole 5a is formed in the side surface of the insulating film 5 covering the side surface of the pillar portion 1b, which position makes processing difficult.

Moreover, multiple pillars 1b, which are defined by the first and second grooves 4 and 15, are formed in a matrix along the first and second directions (Y and X directions), thereby enhancing the integration of a semiconductor device.

Additionally, the second wirings 17, which extend in the second direction (X direction), are formed so as to cover the two opposing side surfaces of the pillar 1b through the gate insulating film 16 in the fourth process. Therefore, a double-gate transistor can be easily formed.

Further, the dopant included in the semiconductor layer 10 is thermally diffused into the semiconductor board 1 after the insulating film 12 is formed over the first wiring 11 in the second process. For this reason, a surface of the semiconductor layer 10 is not oxidized at the thermal diffusion. Accordingly, the cross-sectional area of the semiconductor layer 10, which is part of the first wiring 11, does not decrease, thereby preventing an increase in the specific electrical resistance of the first wiring 11.

Hereinafter, the semiconductor device of the first embodiment is explained with reference to FIGS. 21A, 21B, 21C, and 21D. The semiconductor device of the first embodiment includes, but is not limited to: the upwardly extending pillar portion 1b of the semiconductor board 1; the first wiring 11 adjacent to a bottom region 1d of the pillar portion 1b via the gate insulating film 16, the first wiring 11 extending in the second direction (X direction); the gate insulating film 16 covering the side surfaces of the pillar portion 1b; the first impurity diffusion layer 13 included in a lower region of the pillar portion 1b, the first impurity layer 13 being in contact with the semiconductor layer 10 included in the first wiring 11; and the second impurity diffusion layer 19 in the top region 1f of the pillar portion 1b.

As shown in FIGS. 21A to 21D, multiple pillar portions 1b are arranged in a matrix along the first and second directions. The pillar portions 1b are separated from each other by the first and second grooves 4 and 15. Then, the first wiring 11 fills a bottom portion of the first wiring 11. The second wiring 17 fills a bottom portion of the second groove 15.

Figure 21C:
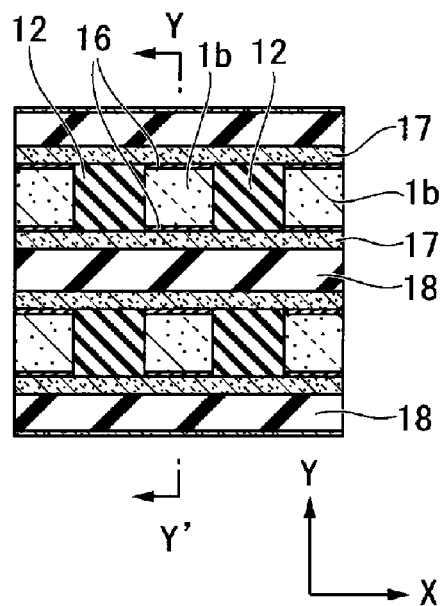
Figure 21D:
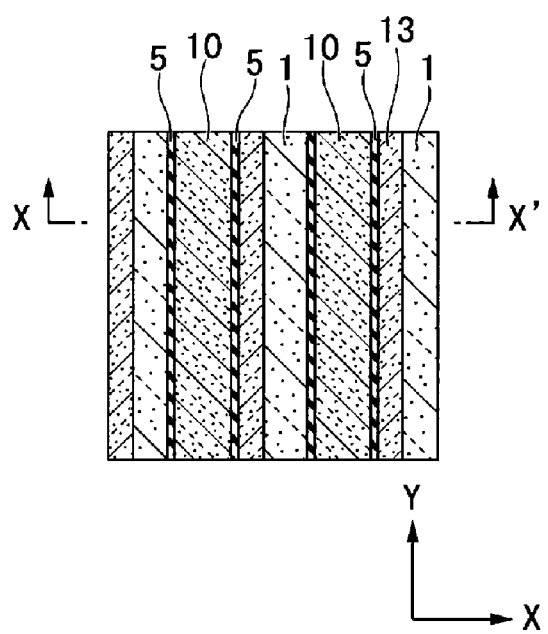

As shown in FIGS. 21A and 21B, the pillar portion 1b includes the top region 1f, the bottom region 1d, and a body region 1e between the top and bottom regions 1f and 1d. The second wiring 17 covers the two opposing side surfaces of the body portion 1e through the gate insulating film 16. As shown in FIG. 21C, the second wiring 17 extends in the second direction (X direction).

As shown in FIG. 21A, the first wiring 11 fills the bottom portion of the first groove 4, which is positioned between each of the pillars 1b. The insulating film 5 covers the inner surfaces of the first groove 4 (the side surfaces 1c of the pillar portion 1b) so as to insulate the first wiring 11 from the semiconductor board 1 and the pillar portion 1b. The first wiring 11 is in contact with the first impurity diffusion layer 13 through the contact hole 5a. The first wiring 11 includes the conductive layer 6 and the semiconductor layer 11. The conductive layer 6 is made of a material that is non-silicidable. The conductive layer 6 includes a titanium nitride film. The semiconductor layer 10 includes a doped silicon film. The first impurity diffusion layer 13 is disposed adjacent to only one side surface of the pillar portion 1b. This is because the first impurity diffusion layer 13 is formed by diffusing the dopant included in the semiconductor layer 10 into the pillar portion 1b through the contact hole 5a. The insulating film 12 is disposed over the first wiring 11.

The contact plug 20 is disposed over the second impurity diffusion layer 19. The capacitor 30 is disposed over the contact plug 20. The capacitor 30 includes the first capacitor electrode 21, the capacitor insulating film 22 covering the first capacitor electrode 21, and the second capacitor electrode 23 covering the capacitor insulating film 22. The first capacitor electrode 21 has a hollow circular cylindrical structure having bottom and side surfaces. The capacitor insulating film 22 covers top, inner, and outer surfaces of the first capacitor electrode 21. The second capacitor electrode 23 covers the first and second capacitor electrodes 21 and 22. Although the capacitor 30 is taken as an example of a memory element, a phase-change element may be used.

The second inter-layer insulating film 24 covers the second capacitor electrode 23. The wiring layer 25 is disposed on the second capacitor electrode 23. The third inter-layer insulating film 26 covers the wiring layer 25 and the second inter-layer insulating film 24. The second and third inter-layer insulating films 24 and 26 include, for example, a silicon oxide film. The wiring layer 25 includes, for example, a titanium nitride film and an aluminum film, which are stacked.

The pillar portion 1b, the gate insulating film 16, and the gate electrode 17b form a MOS transistor. The pillar portion 1b includes the first impurity diffusion layer 13, the body portion 1e, and the second impurity diffusion layer 19. The second impurity diffusion layer 19 functions as a drain of the MOS transistor. The capacitor 30 is connected to the second impurity diffusion layer 19 via the contact plug 20. Thus, the MOS transistor and the capacitor 30 form a DRAM memory cell.

According to the semiconductor device of the first embodiment, the semiconductor layer 10 included in the first wiring 11 is directly in contact with the first impurity layer 13. Accordingly, a silicide layer is not necessary, thereby enabling a reduction in the specific electrical resistance between the first wiring and the impurity diffusion layer, and therefore enabling lower power consumption of the semiconductor device.

Additionally, the first wiring 11 is in contact with the first impurity diffusion layer 13 at the lower region of the pillar portion 1b. The second impurity diffusion layer 19 is disposed at the top region 1f of the pillar portion 1b. Accordingly, the body region 1e can have a sufficient vertical length, thereby preventing the short channel effect.

Further, the insulating film 5 covers the side surfaces 1c of the first portion 1b so as to insulate the first wiring 11 from the pillar portion 1b. The side surface 1c of the first portion has the contact hole 5a. The semiconductor layer 10 included in the first wiring 11 is in contact with the first diffusion layer 13 via the contact hole 5a. Accordingly, a contact plug is not necessary, thereby enhancing the integration of the semiconductor device.

Moreover, the multiple pillar portions 1b, which are defined by the first and second grooves 4 and 5, are arranged in a matrix. The first and second wirings 11 and 17 are disposed in the first and second grooves 4 and 15, respectively, thereby enhancing the integration of the semiconductor device.

Additionally, the two opposing side surfaces of the pillar 1b are covered by the second wirings 17 through the gate insulating film, and thus forming a double-gate transistor.

Further, the capacitor 30, which is a memory element, is connected to the second impurity diffusion layer 19 through the contact plug 20. Accordingly, the semiconductor device can function as a DRAM.

Second Embodiment:

Hereinafter, a second embodiment of the present invention is explained. The second embodiment differs from the first embodiment in that a first wiring 111 has a multi-layered structure including a conductive layer 106 and the semiconductor layer 10 over the conductive layer 106. The conductive layer 106 is made of a tungsten silicide film. The tungsten silicide film has a specific electrical resistance of approximately 70 μΩ·cm, which is lower than that of the titanium nitride film of the first embodiment, thereby enabling a reduction in the resistance of the bit line (first wiring 104), and therefore enabling faster writing of data and faster reading of data.

Hereinafter, a method of manufacturing a semiconductor device according to the second embodiment is explained with reference to FIGS. 22 to 25. Like reference numerals denote like elements between the first and second embodiments. FIGS. 22 to 25 are cross-sectional views illustrating the semiconductor board 1 in the first direction.

Figure 22:
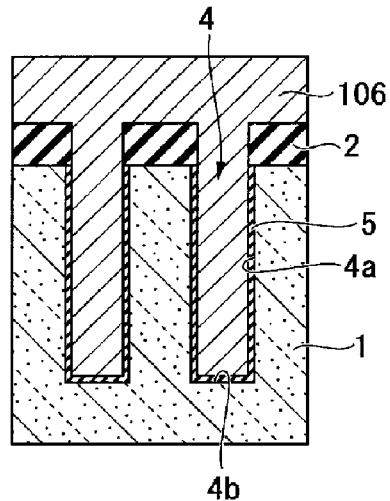
FIGS. 22 to 25 illustrate a process flow indicative of a method of manufacturing a semiconductor device according to a second embodiment of the present invention.

Firstly, similar to the first embodiment, the first groove 4 is formed in the semiconductor board 1, and then the insulating film 5 is formed, as shown in FIG. 22. Then, the conductive layer 106, which fills the first groove 4, is formed. Then, a tungsten silicide film, instead of the titanium nitride film of the first embodiment, is formed as the conductive layer 106. A CVD method is used so that the conductive layer 106 grows and fully covers the first groove 4. The conductive layer 106 has a thickness of, for example, 150 nm.

Figure 23:
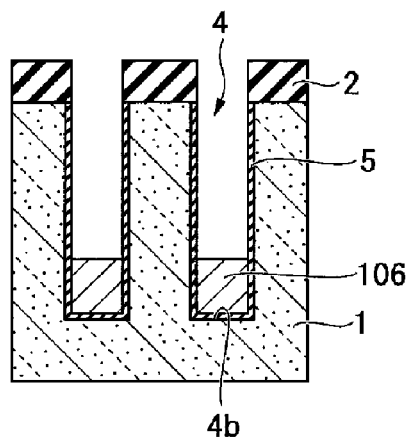

Then, the conductive layer 106 is etched so that a remaining portion of the conductive layer 106 fills a bottom portion of the first groove 4, as shown in FIG. 23. A level of the remaining portion of the conductive layer 106 is, for example, 100 nm, which is measured from the level of the bottom surface 4a of the first groove 4 to the level of the upper surface of the remaining portion of the conductive layer 106.

Figure 24:
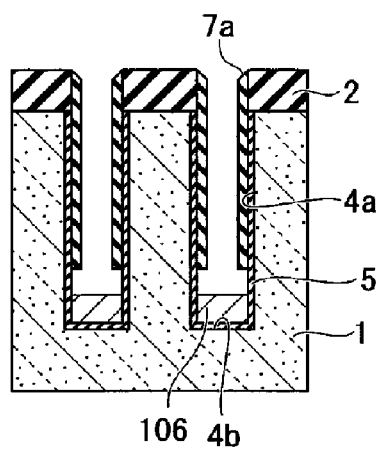

Then, the sidewall film 7a is formed similarly to the first embodiment, as shown in FIG. 24. Then, the upper portion of the conductive layer 106 is isotropically etched so that the level of a remaining portion of the conductive layer 106 becomes, for example, 50 nm from the level of the bottom surface 4a of the first groove 4 to the level of an upper surface of the remaining portion of the conductive layer 106. Thus, a portion of the insulating film 5, which is under the sidewall film 7a, is exposed. In this case, wet etching with an ammonia peroxide mixture may be used instead of the isotropic etching. Alternatively, isotropic dry etching may be used.

Figure 25:
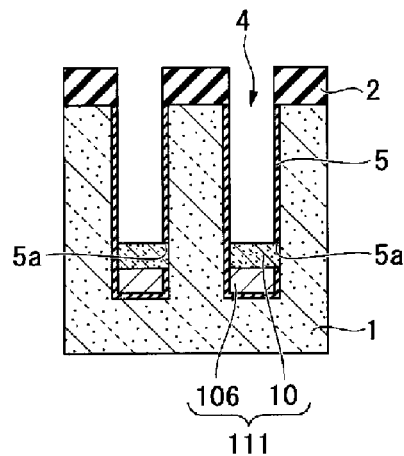

Then, the contact hole 5a is formed in the insulating film 5 similarly to the first embodiment, as shown in FIG. 25. Then, the semiconductor layer 10 is formed over the conductive layer 106. Thus, the first wiring 111 is formed.

The following processes are carried out similarly to those of the first embodiment shown in FIG. 14 and the following drawings. Thus, the semiconductor device of the second embodiment is formed.

According to the semiconductor device of the second embodiment, the first wiring 111 has a multi-layered structure including the conductive layer 106 made of the tungsten silicide film, and the semiconductor layer 10, thereby enabling a reduction in the resistance of the bit line (first wiring 111), and therefore enabling faster writing of data and faster reading of data.

Third Embodiment:

Hereinafter, a semiconductor memory device and a data processing system, which include the semiconductor device of the present invention, are explained as a third embodiment of the present invention. The semiconductor memory device and the data processing system are an example of devices and systems which include a semiconductor device. The semiconductor device of the present invention is widely applicable to devices other than semiconductor memory devices, and to systems other than data processing systems. The data processing system of the third embodiment includes, but is not limited to a computer system.

Figure 26:
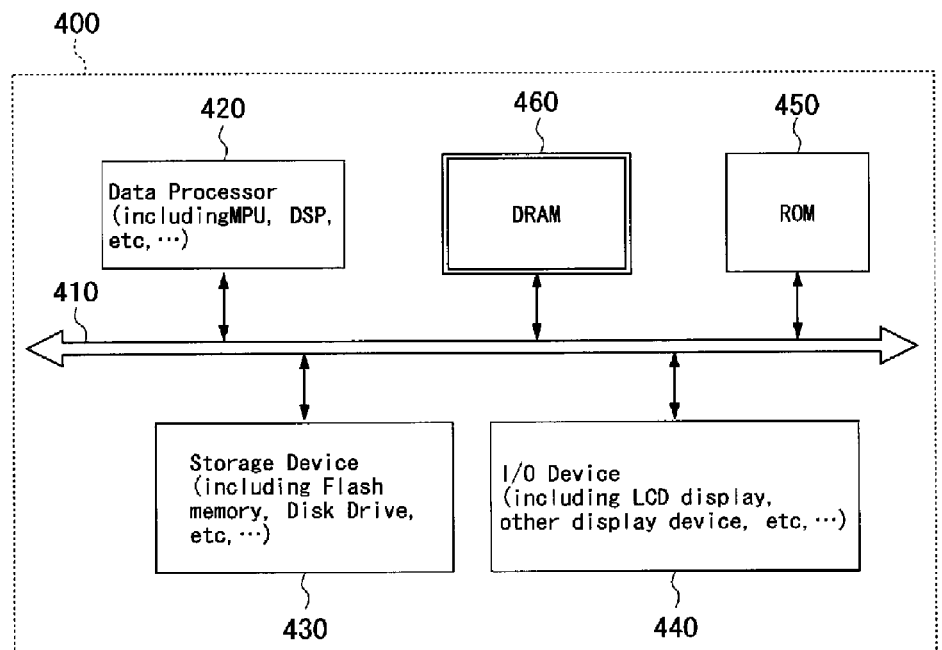
FIG. 26 illustrates a data processing system according to a third embodiment of the present invention.

FIG. 26 illustrates a data processing system 400 of the third embodiment. The data processing system 400 includes, but is not limited to, a data processor 420 and the DRAM of the present invention. The data processor 420 includes, but is not limited to, a microprocessor (MPU) and a digital signal processor (DPS). For simplification, FIG. 26 illustrates a state where the data processor 420 has already been connected to DRAM 460 via the system bus 410. However, the data processor 420 may be connected to DRAM 460 not via the system bus 410, but via a local bus.

For simplification, only one system bus 410 is shown in FIG. 26. However, multiple system buses 410 may be provided in serial or parallel according to need.

Regarding this system, a storage device 430, an I/O device 440, and RAM 450 are connected to the system bus 410. However, these elements are not always necessary. The I/O device 440 may include only one of an input device and an output device. The number of each element included in the system is not limited to one, and multiple identical elements may be included therein.

According to DRAM 460 of the present invention, the specific electrical resistance of DRAM 460 with respect to the bit line (first wiring) is lower than DRAM of the related art. Additionally, the specific electrical resistance between the bit line and the first impurity diffusion layer is also lower, thereby enabling lower power consumption. Therefore, the data processing system 400 can be mounted on mobile electronic devices requiring low power consumption.

As used herein, the following directional terms "forward," "rearward," "above," "downward," "vertical," "horizontal," "below," and "transverse," as well as any other similar directional terms refer to those directions of an apparatus equipped with the present invention. Accordingly, these terms, as utilized to describe the present invention should be interpreted relative to an apparatus equipped with the present invention.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

It is apparent that the present invention is not limited to the above embodiments, but may be modified and changed without departing from the scope and spirit of the invention.

For example, in one embodiment, a method of manufacturing a semiconductor device may include, but is not limited to the following processes. A first groove is formed in a semiconductor substrate. A first insulating film covering at least side and bottom surfaces of the first groove is formed. A conductive film filling a bottom portion of the first groove is formed. The conductive film comprises a non-silicidable substance. A hole is formed in the first insulating film. The hole is positioned higher in level than the conductive film. A semiconductor film is formed over the conductive film. The semiconductor film fills the hole and is in contact with the semiconductor substrate.

The method may further include the following process. A dopant included in the semiconductor film is diffused into the semiconductor substrate via the hole to form an impurity region.

Regarding the method, forming the hole may include the following processes. A second insulating film covering the side surface of the first groove through the first insulating film is formed. The second insulating film partially covers an upper surface of the conductive film. The conductive film is partially removed using the second insulating film as a first mask so that the upper surface of the conductive film is lowered in level, and that a first portion of the first insulating film is exposed between a bottom surface of the second insulating film and a lowered upper surface of the conductive film. The first portion of the first insulating film is selectively removed.

Regarding the method, selectively removing the first portion of the first insulating film may include the following processes. A flattening film filling the first groove is formed. The flattening film covers the semiconductor substrate. A second mask is formed over the flattering film. The second mask has a second groove extending in parallel with the first groove. The second groove partially overlaps the first groove in plan view. The flattening film is selectively removed using the second mask so that the first portion of the first insulating film and a second portion of the second insulating film are exposed. The first and second portions are inside the second groove in plan view. The first portion of the first insulating film is removed using the conductive film, the flattening film, and the second portion of the second insulating film as third masks. The third masks are removed.

The method may further include the following process. A third insulating film filling the first groove is formed over the semiconductor film.

In another embodiment, a method of manufacturing a semiconductor device may include, but is not limited to the following processes. First and second grooves are formed in a semiconductor substrate. First and second insulating films covering at least first and second inner surfaces of the first and second grooves, respectively, are formed. First and second conductive films filling first and second bottom portions of the first and second grooves, respectively, are formed. The first and second conductive films include first and second substances that are non-silicidable, respectively. First and second holes are formed in the first and second insulating films. The first and second holes are higher in level than the first and second conductive films, respectively. First and second semiconductor films are formed over the first and second conductive films. The first and second semiconductor films fill the first and second holes, respectively, and are in contact with the semiconductor substrate.

The method may further include the following processes. A first dopant included in the first semiconductor film is diffused into the semiconductor substrate via the first hole to form a first region adjacent to the first hole. A second dopant included in the second semiconductor film is diffused into the semiconductor substrate via the second hole to form a second region adjacent to the second hole.

The method may further include the following process. A third insulating film is formed over the first and second semiconductor films. The third insulating film fills the first and second grooves.

The method may further include the following process. Third and fourth grooves are formed in the semiconductor substrate to form a first portion of the semiconductor substrate and a second portion of the third insulating film. Each of the third and fourth grooves crosses the first and second grooves. The first and second portions extend upwardly. The first and second portions are defined by the first to fourth grooves.

The method may further include the following process. A fourth insulating film covering at least a side surface of the first portion of the semiconductor substrate is formed.

The method may further include the following processes. A third conductive film, which covers inner surfaces of the third and fourth grooves and top surfaces of the first and second portions, is formed. The third conductive film is selectively removed so that a remaining portion of the third conductive film covers a lower side surface of the first portion through the fourth insulating film. The remaining portion of the third conductive film covers a lower side surface of the second portion.

The method may further include the following process. A second dopant is introduced into a top region of the first portion to form a third region.

The method may further include the following process. A thermal treatment is carried out so that the first to third regions are thermally diffused.

The method may further include the following processes. A fifth insulating film filling the third and fourth grooves is formed. A contact plug is formed over the third region of the first portion.

The method may further include the following processes. A first capacitor electrode covering the contact plug and the fifth insulating film is formed. A sixth insulating film covering the first capacitor electrode is formed. A second capacitor electrode covering the sixth insulating film is formed.

In still another embodiment, a method of manufacturing a semiconductor device may include, but is not limited to the following processes. A plurality of first grooves are formed in a semiconductor substrate. A plurality of second grooves crossing the plurality of first grooves are formed in the semiconductor substrate so as to form a plurality of pillar portions of the semiconductor substrate. A plurality of first conductive films covering side surfaces of the plurality of second grooves are formed. The plurality of first conductive films extend along the plurality of second grooves. A first dopant is introduced into a plurality of top regions of the plurality of pillar portions to form a plurality of first regions.

The method may further include the following processes. After the plurality of first grooves are formed, before the plurality of second grooves are formed, a plurality of first insulating films covering inner surfaces of the plurality of first grooves are formed. A plurality of second conductive films filling bottom portions of the plurality of first grooves are formed. The second conductive films include a non-silicidable substance. A hole is formed in each of the plurality of first insulating films. The hole is positioned higher in level than each of the plurality of second conductive films. A plurality of semiconductor films are formed over the plurality of second conductive films. Each of the plurality of semiconductor films fills the hole and is in contact with the semiconductor substrate. A plurality of second insulating films are formed over the plurality of second conductive films. The plurality of second insulating films fill the plurality of first grooves.

The method may further include the following process. A second dopant included in the plurality of semiconductor films is diffused into the semiconductor substrate via the hole to form a plurality of second regions.

Regarding the method, a plurality of second pillar portions of the plurality of second insulating films are formed by forming the plurality of second grooves.

Regarding the method, the plurality of first conductive films covers side surfaces of the plurality of second pillar portions.

What is claimed is:

1. A semiconductor device, comprising:
   a first groove extending in a semiconductor substrate in a first direction, the first groove having first and second side surfaces facing each other, the first groove having a bottom surface;
   a first insulating film covering the first and second side surfaces and the bottom surface and having a hole on a portion of the first side surface;
   a first conductive layer covering the bottom surface with the first insulating film interposed between the first conductive layer and the bottom surface; and
   a semiconductor film provided over the first conductive layer and in contact with the first side surface through the hole.

2. The semiconductor device according to claim 1, wherein the first conductive layer comprises a material that does not form silicide.

3. The semiconductor device according to claim 1, further comprising:
   a first diffusion layer containing a first impurity placed on the first side surface and in contact with the semiconductor film through the hole; and
   a second diffusion layer containing a second impurity placed in an upper surface of the semiconductor substrate that includes a part of the first side surface.

4. The semiconductor device according to claim 1, further comprising:
   a second insulating film over the semiconductor film.

5. The semiconductor device according to claim 4, further comprising:
   two second grooves extending in the semiconductor substrate in a second direction that intersects the first direction, the two second grooves each having a bottom face that is placed above the semiconductor film; and
   third and fourth side surfaces of the semiconductor substrate facing each other provided by the two second grooves, respectively.

6. The semiconductor device according to claim 5, further comprising:
   a gate insulating film covering both the third and fourth side surfaces.

7. The semiconductor device according to claim 6, further comprising:
   a second conductive layer covering the third side surface via the gate insulating film; and
   a third conductive film covering the fourth side surface via the gate insulating film.

8. The semiconductor device according to claim 7, wherein the second and third conductive layers extend continuously to a side portion of the second insulating film along the second direction and are disposed over the semiconductor film, respectively.

* * * * *